US011929686B2

(12) United States Patent
Druant

(10) Patent No.: US 11,929,686 B2
(45) Date of Patent: Mar. 12, 2024

(54) POWER CONVERSION DEVICE

(71) Applicant: Dana Belgium N.V., Bruges (BE)

(72) Inventor: Joachim Druant, Bruges (BE)

(73) Assignee: DANA BELGIUM N.V., Bruges (BE)

( * ) Notice: Subject to any disclaimer, the term of this patent is extended or adjusted under 35 U.S.C. 154(b) by 124 days.

(21) Appl. No.: 17/446,822

(22) Filed: Sep. 2, 2021

(65) Prior Publication Data

US 2022/0069728 A1 Mar. 3, 2022

(30) Foreign Application Priority Data

Sep. 3, 2020 (DE) ..................... 20 2020 105 092.3

(51) Int. Cl.
*H05K 7/20* (2006.01)
*H02M 7/00* (2006.01)

(52) U.S. Cl.
CPC ........ *H02M 7/003* (2013.01); *H05K 7/20854* (2013.01); *H05K 7/209* (2013.01)

(58) Field of Classification Search
None
See application file for complete search history.

(56) References Cited

U.S. PATENT DOCUMENTS

| 9,300,046 | B2* | 3/2016 | Singh | H01F 38/14 |
|---|---|---|---|---|
| 9,985,490 | B2* | 5/2018 | Owen | H02K 11/33 |
| 11,158,461 | B2* | 10/2021 | Kodachi | H01G 2/08 |
| 11,332,087 | B2* | 5/2022 | Young | H02M 7/003 |
| 2007/0284157 | A1* | 12/2007 | Heller | H02K 7/006 180/54.1 |
| 2015/0249371 | A1* | 9/2015 | Owen | H02K 11/0094 310/198 |
| 2016/0111700 | A1* | 4/2016 | Ikenuma | H01G 11/38 429/126 |
| 2020/0312532 | A1* | 10/2020 | Fukasaku | H01F 17/06 |

\* cited by examiner

*Primary Examiner* — Courtney L Smith
(74) *Attorney, Agent, or Firm* — McCoy Russell LLP

(57) ABSTRACT

Disclosed herein are power conversion devices comprising power modules, capacitor modules, and support frames. The power modules may be operable to convert direct current (DC) electricity to alternating current (AC) electricity. The capacitor modules may be electrically connected to the power modules. The support frames may house the power modules and conductor plates, and the capacitor modules may be at least partially wound around exterior sides of the support frames. Such arrangements may advantageously take up less installation space and/or have better form factors than power conversion devices with cylindrical capacitors.

19 Claims, 1 Drawing Sheet

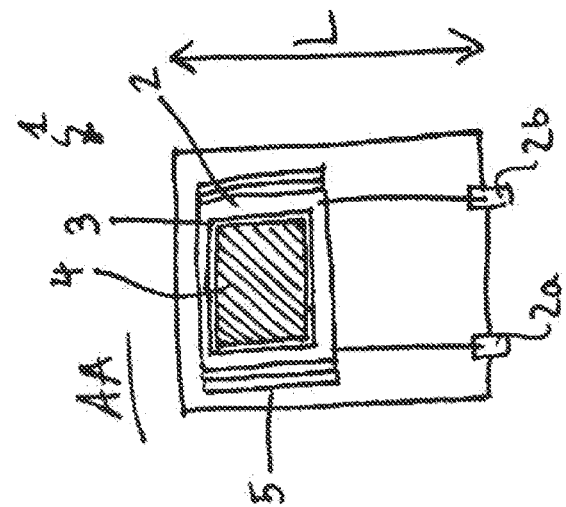
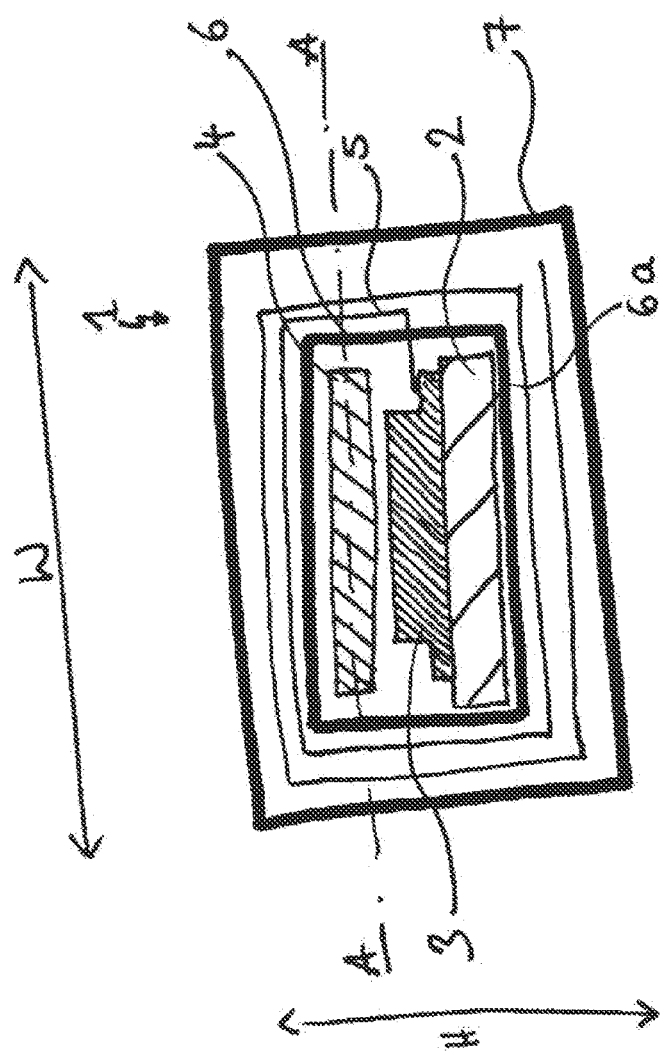

POWER CONVERSION DEVICE

CROSS-REFERENCE TO RELATED APPLICATION

The present application claims priority to German Utility Model Application No. 20 2020 105 092.3, entitled "POWER CONVERSION DEVICE," and filed on Sep. 3, 2020. The entire contents of the above-listed application are hereby incorporated by reference for all purposes.

TECHNICAL FIELD

The present disclosure primarily relates to power conversion devices, such as power conversion devices for driving hybrid vehicles or electric vehicles.

BACKGROUND AND SUMMARY

Power conversion devices, also referred to as inverters, may include capacitors. Most inverters comprise electrolytic capacitors on a high voltage direct current bus. These capacitors are typically made of two layers of metal foil which are separated by a dielectric. These stacked layers are rolled into a cylinder. These capacitor-cylinders require a lot of space in a power conversion device.

Further, power conversion devices generate heat and this heat should be extracted from the power conversion device to improve the performance of the inverter and/or to prevent early degradation thereof. For example, due to high current-ripples, the capacitor temperature increases such that derating might be implemented, resulting in limited inverter power.

The disclosed mechanisms and methods may advantageously develop power conversion devices addressing the aforementioned problems.

The aforementioned problems may be addressed by power conversion devices with the features of disclosed herein. Advantageous designs and further developments of the disclosed mechanisms and methods may be deduced from the features of the dependent claims and the following description.

The present disclosure provides, in a variety of embodiments, a power conversion device for a vehicle. The proposed power conversion device comprises a power module configured to convert direct current (DC) to alternating current (AC). Further, the power conversion device comprises a capacitor module electrically connected to the power module and a support frame that houses the power module and the conductor plate. The capacitor module is at least partially wound around an exterior side of the support frame.

Such an arrangement of the capacitor module, which may also be referred to herein as a "capacitor" or as "capacitors," may have the advantage that the capacitor takes up less installation space, or has a better form factor, such as compared to power conversion devices with cylindrical capacitors.

The capacitor module may be wound completely or partially around the support frame. The capacitor module may be arranged forming a complete coil or merely a part of a coil. The capacitor module may be wound such that the capacitor forms overlapping layers.

In some embodiments, the capacitor module comprises several windings which are arranged overlapping one another, such that several layers of the capacitor module are arranged on top of each other.

The capacitor may be fixed to the support frame by gluing, clamping, or the like.

In some embodiments, the capacitor module is wound around the support frame at least once, at least twice, or at least three times.

The support frame may be a box comprising a base plate and/or side walls and/or a cover plate. Additionally, or alternatively, the support frame may comprise supporting struts. The supporting struts may define edges of the box and/or a grid structure. The supporting struts may form the side walls and/or the cover plate and/or the base plate of the box.

In some embodiments, the support frame has a cuboid or a cube shape. For some embodiments, the support frame may have a different shape, for example a shape comprising rounded areas or a combination of curved and square sections.

In some embodiments, the power conversion device has an axis, for example a longitudinal axis, and the capacitor module is wound at least partially around the axis, for instance around the longitudinal axis, wherein "at least partially" means that the capacitor is not necessarily wound all the way around the axis.

In some embodiments, the capacitor module comprises a film capacitor, for example a polypropylene film capacitor. Alternatively, the capacitor module comprises an electrolytic capacitor or another type of capacitor.

In some embodiments, the capacitor module comprises a first metal foil having a first and a second side, a second metal foil having a first and a second side, and a dielectric layer. The first and the second metal foils are typically arranged such that the first sides of the first and the second metal foils are facing each other, wherein the dielectric is arranged between the first and the second metal foil separating the metal foils. Alternatively, a dielectric may be metallized on one side, wherein, for example, electrodes may be formed by vacuum evaporation of metal deposited directly onto the dielectric. Two layers of this "dielectric with metal" may be at least partially wound around an exterior side of the support frame.

The first and the second metal foils may comprise aluminium and/or zinc. The dielectric may comprise Polypropylene (PP) or anther insulating plastic film.

In some embodiments, in the unwound state, the capacitor may have a length of at least 300 meters (m), at least 350 m, or at least 400 m. For some embodiments, in the unwound state, the capacitor may have a length of at most 600 m, at most 500 m, or at most 450 m.

In some embodiments, the capacitor may have a width of at least 0.15 m, at least 0.2 m, or at least 0.22 m. For some embodiments, the capacitor may have a width of at most 0.4 m, at most 0.3 m, or at most 0.25 m.

The capacitor module may comprise more than one capacitor. A plurality of capacitors may be arranged adjacent to one another, each wrapped, at least partially, around the support frame. The capacitors may be of the same type or of different types.

In some embodiments, the power conversion device further includes a cooling element, for example a cooling plate. The cooling element may comprise a port to receive a coolant and a port to discharge the coolant. The cooling element may comprise conduits connected to the connections ports and to transport the coolant through the conduits to absorb heat.

In some embodiments, the support frame houses the cooling element and/or the cooling plate. The cooling element may be arranged completely or at least partially in an interior space defined by the support frame. For instance, connectors for receiving or discharging a coolant may be arranged outside the support frame.

In some embodiments, the cooling element has an upper side arranged adjacent to the power module.

A lower side of the cooling element may be arranged adjacent to the support frame and or adjacent to the capacitor.

The lower side of the cooling element may be arranged on top of an upper side of a base plate of the support frame. A power pack may be arranged on top of an upper side of the cooling element such that the cooling element may absorb heat dissipated by the power pack. The capacitor module may be wound around the support frame such that some layers of the capacitor are arranged beneath the cooling element, for instance contiguously beneath the cooling element, such that the cooling element may absorb heat dissipated by the capacitor.

The power module typically comprises an AC terminal and a DC terminal. The capacitor is typically electrically connected to the DC terminal of the power module.

The power conversion device may comprise a gate driver and/or a controller logic. The gate driver and/or the controller logic may be housed by the support frame, which means that the gate driver and/or the controller logic may be arranged in an interior defined by the support frame.

In some embodiments, the support frame is a metal support frame. The support frame may comprise steel and/or aluminium. For some embodiments, the support frame may comprise a plastic, for example non-flammable plastic and/or fibre-reinforced plastic.

In some embodiments, the support frame may have a length of at least 0.15 m, at least 0.2 m, or at least 0.22 m. For some embodiments, the support frame may have a length of at most 0.4 m, at most 0.3 m, or at most 0.25 m.

In some embodiments, the support frame may have a width of at least 0.15 m, at least 0.2 m, or at least 0.22 m. For some embodiments, the support frame may have a width of at most 0.4 m, at most 0.3 m, or at most 0.25 m.

In some embodiments, the support frame may have a height of at least 0.05 m, at least 0.07 m, or at least 0.1 m. For some embodiments, the support frame may have a height of at most 0.2 m, at most 0.15 m, or at most 0.12 m.

According to some embodiments, the power conversion device further comprises a housing. The housing may house the gate driver and/or the controller logic and/or the power module and/or the cooling element and/or the capacitor module.

In some embodiments, the housing is a metal housing. The housing may comprise steel and/or aluminium. For some embodiments, the housing may comprise a plastic, for example non-flammable plastic and/or fibre-reinforced plastic.

In some embodiments, the housing may have a length of at least 0.15 m, at least 0.2 m, or at least 0.22 m. For some embodiments, the housing may have a length of at most 0.4 m, at most 0.3 m, or at most 0.25 m.

In some embodiments, the housing may have a width of at least 0.15 m, at least 0.2 m, or at least 0.25 m. For some embodiments, the housing may have a width of at most 0.4 m, at most 0.3 m, or at most 0.25 m.

In some embodiments, the housing may have a height of at least 0.05 m, at least 0.1 m, or at least 0.13 m. For some embodiments, the housing may have a height of at most 0.3 m, at most 0.2 m, or at most 0.15 m.

The use of the word "a" or "an" when used in conjunction with the term "comprising" in the claims and/or the present specification may mean "one", but it is also consistent with the meaning of "one or more", "at least one", and "one or more than one". Similarly, the word "another" may mean at least a second or more.

As used herein, terms such as "first," "second," "third," and so on are used merely as labels, and are not intended to impose any numerical requirements, any particular positional order, or any sort of implied significance on their objects.

As used herein, terminology in which "an embodiment," "some embodiments," or "various embodiments" are referenced signify that the associated features, structures, or characteristics being described are in at least some embodiments, but are not necessarily in all embodiments. Moreover, the various appearances of such terminology do not necessarily all refer to the same embodiments.

As used herein, terminology in which elements are presented in a list using "and/or" language means any combination of the listed elements. For example, "A, B, and/or C" may mean any of the following: A alone; B alone; C alone; A and B; A and C; B and C; or A, B, and C.

Further objects, advantages, and features will become more apparent upon reading of the following non-restrictive description of illustrative embodiments thereof, given by way of example only with reference to the accompanying drawings.

BRIEF DESCRIPTION OF THE FIGURES

FIG. 1 is a schematic cross-sectional view of a power conversion device, perpendicular to a longitudinal axis, in accordance with various embodiments.

FIG. 2 is a schematic sectional top view along line AA onto the power conversion device according to FIG. 1.

DETAILED DESCRIPTION

In FIG. 1, a power conversion device 1 is illustrated. The power conversion device 1 comprises a power module 3, a cooling plate 2, a gate driver and controller logic 4, a capacitor 5, a support frame 6, and a housing 7. The power module 3 is arranged on top of the cooling plate 2 such that the cooling plate 2 may absorb heat dissipated by the power module 3.

The support frame 6 is made of aluminum and houses the cooling plate 2, the power module 3, and the gate driver and controller logic 4. The gate driver and controller logic 4 are electrically connected to the power module 3. The support frame 6 has rectangular shape defining the edges of a box. Further, the support frame 6 has a base plate. The support frame 6 has a length of 0.22 m, a width of 0.22 m, and a height 0.1 m. The values are approximate, such as with a tolerance of 1 to 3 centimetres.

The power module comprises an AC terminal and a DC terminal.

The capacitor 5 is a PP-film capacitor of 550 microfarads (µF) with a film thickness of 7 microns (µm). In some embodiments the film capacitor may have another thickness, for example at least 2 µm, at least 3 µm, at most 10 µm, and/or at most 8 µm. The shown capacitor has a width of 0.22 m and a length (in unwound state) of 450 m. The capacitor 5 comprises a first metal foil and a second metal foil arranged on top of each other and separated by a dielectric layer. The capacitor 5 is wrapped around an exterior side of the support frame 6 and electrically connected to the DC terminal of the power module 3. The capacitor 5 operates to smooth out ripple voltage and ripple current for the DC circuit sections and to supply stable electric power to the power module 3.

When wound around the support frame 6 as shown in FIG. 1, the capacitor 5 comprises 660 turns. In the illustrated example, the capacitor forms a total layer of 0.01 m thickness which is wound around the support frame 6.

The capacitor 5 is arranged adjacent to the cooling plate 2 such that a coolant passing through conduits provided in the cooling plate 2 may absorb heat emitted by the capacitor 5.

The support frame 6 with the capacitor 5 wrapped around is disposed in the housing 7. The housing 7 is a metal box with a removable lid. The lid may be screwed or clamped to the side walls of the box. The housing 7 may comprise openings to receive connectors for coolant or electricity, for example. The housing has a length L of 0.22 m, a width W of 0.25 m, and a height H of 0.13 m. The values are approximate, such as with a tolerance of 1 to 3 centimetres.

In FIG. 2, the power conversion device 1 of FIG. 1 is illustrated in a schematic cross-section along line AA, shown in FIG. 1.

The cooling plate 2 has a receiving port 2a and a discharge port 2b for receiving and discharging coolant. The receiving port 2a and the discharge port 2b are each arranged in an opening of the housing 7, and fluidly connected to the cooling plate 2.

The invention claimed is:

1. A power conversion device for a vehicle, comprising:
    a power module operable to convert direct current (DC) to alternating current (AC);
    a capacitor module electrically connected to the power module; and
    a support frame that houses the power module and a conductor plate,
    wherein the capacitor module is at least partially wound around an exterior side of the support frame to form a capacitor having overlying layers, and
    wherein the power module is positioned on a side of the support frame that is opposite the exterior side.

2. The power conversion device according to claim 1, wherein the power conversion device has an axis, and the capacitor module is wound at least partially around the axis.

3. The power conversion device according to claim 2, wherein the axis is a longitudinal axis.

4. A power conversion device for a vehicle, comprising:
    a power module operable to convert direct current (DC) to alternating current (AC);
    a capacitor module electrically connected to the power module; and
    a support frame that houses the power module and a conductor plate,
    wherein the capacitor module is at least partially wound around an exterior side of the support frame,
    wherein the power module is positioned on a side of the support frame that is opposite the exterior side, and
    wherein the capacitor module is wound around the support frame at least once.

5. The power conversion device according to claim 4, wherein the capacitor module is wound around the support frame at least twice.

6. The power conversion device according to claim 4, wherein the capacitor module is wound around the support frame at least three times.

7. The power conversion device according to claim 1, wherein the capacitor module comprises:
    a first metal foil having a first side and a second side;
    a second metal foil having a first side and a second side; and
    a dielectric layer,
    wherein the first metal foil and the second metal foil are arranged such that the first sides of the first metal foil and the second metal foil are facing each other; and
    wherein the dielectric is arranged between the first metal foil and the second metal foil and separates the first metal foil and the second metal foil.

8. The power conversion device according to claim 1, further comprising a cooling plate.

9. The power conversion device according to claim 8, wherein the support frame further houses the cooling plate.

10. The power conversion device according to claim 8, wherein the cooling plate has an upper side arranged adjacent to the power module.

11. The power conversion device according to claim 8, wherein the cooling plate has a lower side arranged adjacent to at least one of: the support frame and the capacitor module.

12. The power conversion device according to claim 1, wherein the support frame is a metal support frame.

13. The power conversion device according to claim 12, wherein the support frame comprises at least one of: steel and aluminum.

14. The power conversion device according to claim 1, further comprising a housing.

15. The power conversion device according to claim 1, wherein the support frame has a cuboid shape.

16. The power conversion device according to claim 1, wherein a portion of the capacitor module that is at least partially wound around the exterior side of the support frame is positioned between the support frame and a housing of the power conversion device.

17. The power conversion device according to claim 1, wherein a portion of the capacitor module is positioned on the side of the support frame that is opposite the exterior side.

18. The power conversion device according to claim 1, wherein an interior of the support frame surrounds the power module.

19. The power conversion device according to claim 1, wherein the capacitor module extends into an interior of the support frame.

* * * * *